US005568563A

United States Patent [19]
Tanaka et al.

[11] Patent Number: 5,568,563
[45] Date of Patent: Oct. 22, 1996

[54] METHOD AND APPARATUS OF PATTERN RECOGNITION

[75] Inventors: Ken-ichi Tanaka; Masako Shimizu, both of Hyogo, Japan

[73] Assignee: Mitsubishi Denki Kabushiki Kaisha, Tokyo, Japan

[21] Appl. No.: 237,138

[22] Filed: May 3, 1994

[30]   Foreign Application Priority Data

May 17, 1993 [JP] Japan ................................. 5-114807

[51] Int. Cl.$^6$ .................................................. G06K 9/09
[52] U.S. Cl. ......................... 382/144; 348/129; 382/149
[58] Field of Search ........................... 382/209, 216, 382/181, 218, 221, 293, 294, 296, 144, 147, 149, 236, 150; 348/129, 130, 87

[56]           References Cited

U.S. PATENT DOCUMENTS

| 4,669,123 | 5/1987 | Kobayashi et al. . |
| 5,163,101 | 11/1992 | Deering ..................................... 382/12 |

FOREIGN PATENT DOCUMENTS

| 2740394 | 3/1978 | Germany . |
| 2842424 | 5/1979 | Germany . |
| 0217118 | 8/1986 | Germany . |
| 63-120382 | 11/1986 | Japan . |
| 2-170284 | 7/1990 | Japan . |
| 5-35878 | 2/1993 | Japan . |

OTHER PUBLICATIONS

"An Algorithm for Finding Newest Neighbors in Constart Average Time with a linear Space Complexity" Luisa Mico, Jose Oncina and Ennque Vidal IEEE Compert. SOC, Press 1992.

*Primary Examiner*—Joseph Mancuso
*Attorney, Agent, or Firm*—Wolf, Greenfield & Sacks, P.C.

[57]           ABSTRACT

A pattern recognition apparatus and method in which a set is produced which includes a fundamental pattern vector on a basis place and other fundamental pattern vectors of the patterns displaced from the fundamental pattern on the basis place. Then a subspace spanned by fundamental pattern vectors included in the set is generated. A test pattern vector of a wafer to be inspected is projected to the subspace and similarity between the fundamental vectors and the test pattern vector is measured. Further, an image is used after it is filtered by a normalization filter. Furthermore, sensitivity of pattern recognition is varied by changing the dimension of the pattern vectors. Moreover, for objects expressed by numerical values which can not be compared directly, the data of the objects are transformed into images and, then, a set of fundamental pattern vectors are worked out.

16 Claims, 15 Drawing Sheets

FIG.4
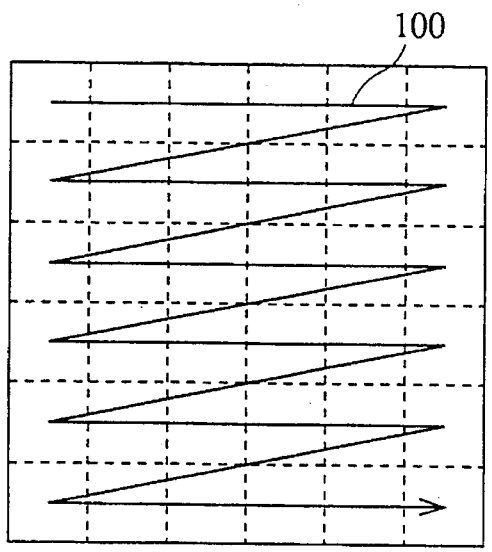
FIG.5A
FIG.5B
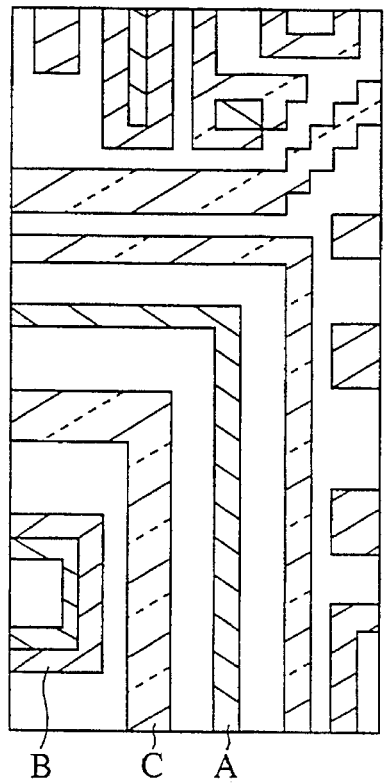
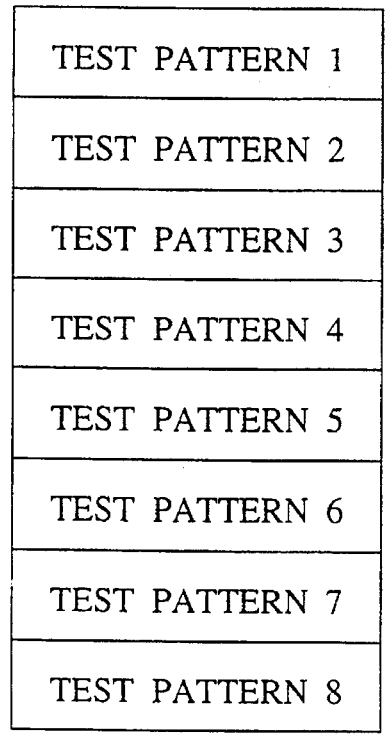

DEVIATION OF POSITION ×$10^{-6}$m

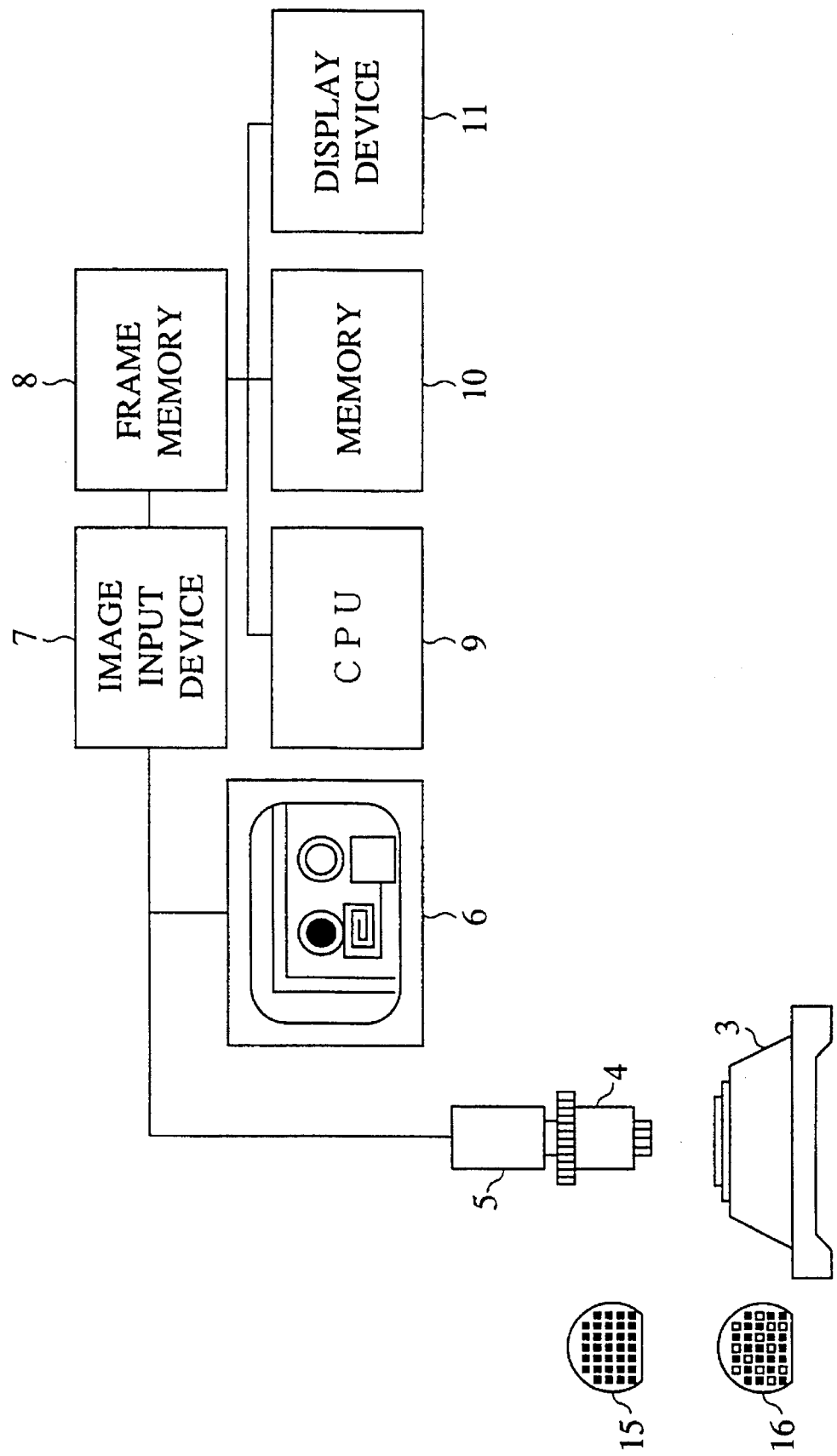

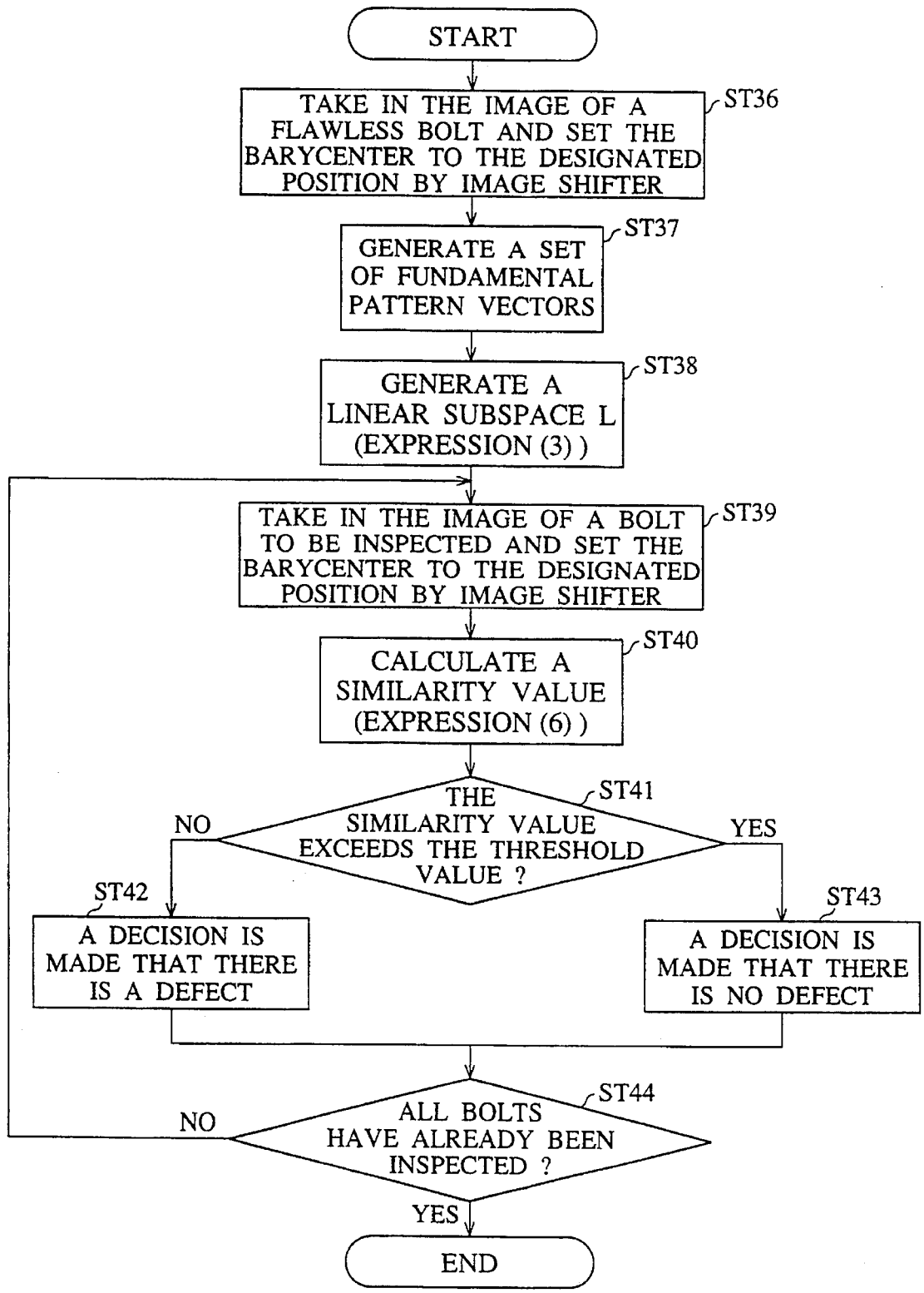

FIG.18A
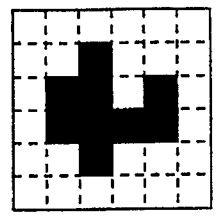
FIG.18B
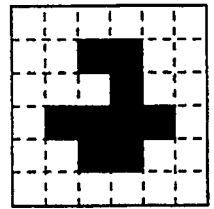
FIG.18C
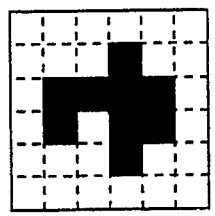
FIG.18D
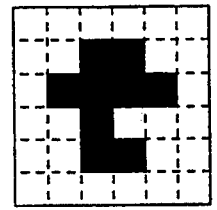
FIG.19 (PRIOR ART)
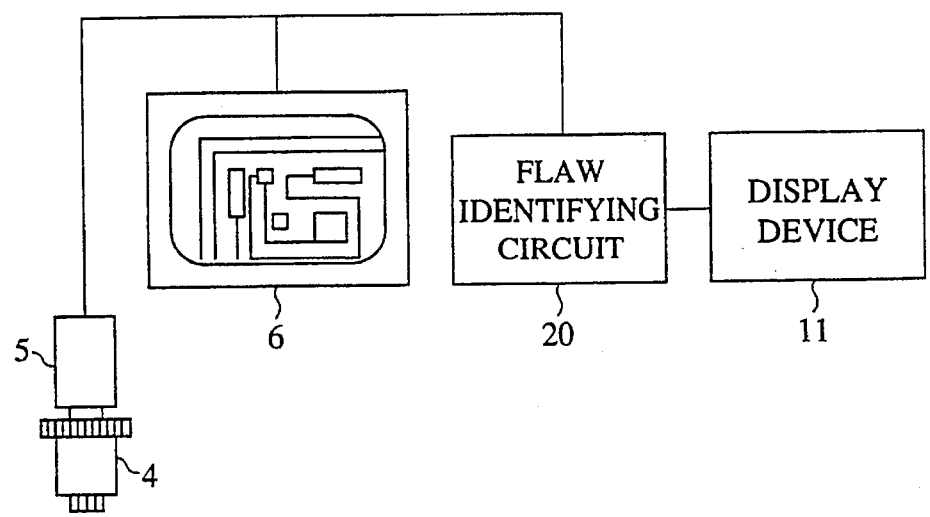

METHOD AND APPARATUS OF PATTERN RECOGNITION

BACKGROUND OF THE INVENTION

1. Field of the Invention

This invention relates to pattern recognition which is used for automating eye-sight inspections of products for example.

2. Description of the Related Art

FIG. 19 is a block diagram showing the structure of a conventional wafer surface defect inspection apparatus disclosed in television society bulletin "wafer surface defect inspection apparatus using Very-Large-Scale-Integrated circuit", Vol. 36, No. 1, pp 38–44. In FIG. 19, numeral 2 denotes a wafer to be inspected, numeral 3 denotes a moving mechanism which moves the wafer 2, numeral 4 denotes a microscope which magnifies the pattern image of the surface of wafer 2, numeral 5 denotes a Charge Coupled Device (CCD) camera which takes in the image of the wafer 2 magnified by the microscope 4, numeral 6 denotes a display which monitors the image taken in by CCD camera 5, numeral 20 denotes a flaw identifying circuit which identifies a flaw from the image taken in by CCD camera 5, numeral 11 denotes a display which displays an inspection result.

FIG. 20 is a flow chart showing the operation of the apparatus described above. At first, the image data of wafer 2 taken by CCD camera 5 are inputted to flaw identifying circuit 20 (step ST1). Then, flaw identifying circuit 20 differentiates the image data in pre-processing, changes the differentiated data into binary code, and processes boundary extraction (step ST2). Next, the circuit 20 sets matching frames A and B in the same screen of the differentiated binary image such that these frames are away from each other by the distance of the repetition of the pattern (step ST3). Next, the circuit 20 compares pixels in the frame A with pixels in the frame B on the basis of bit-by-bit relative to the frames (step ST4). If the values of pixels in corresponding positions are different each other (step ST5), a decision is made that either the frame A or the frame B contains a defect (step ST6). If the values are the same, a decision is made that each frame does not contain a defect (step ST7). A whole wafer is inspected by moving these matching frames A and B (step ST8).

However, it is impossible for the above described apparatus to identify which frame contains a defect because whether two patterns which are next to each other in the same wafer are different or not is merely judged. Further, the frame A and frame B must be placed such that the distance between the frame A and the frame B is the same as the repetition distance of the pattern. This requires a high precision in placing the frames A and B and it is difficult to obtain such high precision especially for fine patterns like semiconductor patterns. Moreover, because of differentiating the image and changing the image into a binary code, noise contained in the image or a change of lighting may cause a brightness value to be inverted and thereby a decision for defect may be wrongly made.

SUMMARY OF THE INVENTION

In view of the foregoing, the first object of the present invention is to obtain a pattern recognition method or apparatus which is not affected by deviation of the position of the patterns or a change of lighting and which can output a pattern recognition result with high precision even for fine patterns.

The second object of the present invention is to obtain pattern recognition method or apparatus which can vary the sensitivity of detecting defects in patterns.

The third object of the present invention is to obtain pattern recognition method or apparatus which can work out a similarity value of the patterns even if the objects to be inspected are expressed by values which cannot be compared directly such as a comparison between two groups of CAD data each of which has a different minimum coordinate resolution from that of the other.

The fourth object of the present invention is to obtain pattern recognition method or apparatus can work out a similarity value of the patterns without being affected by rotational displacement of the patterns as well as parallel displacement of the patterns.

In order to accomplish the above objects, a pattern recognition of the invention is performed as follows.

A set is generated which consists of a first fundamental pattern vector of a first fundamental pattern on a basis place of the first image and second fundamental pattern vectors of second fundamental patterns displaced from the first fundamental pattern. A linear subspace is, then, generated which is spanned by the first fundamental pattern vector and the second fundamental pattern vectors included in the set. Next, a test pattern vector is generated based on the second image. Then, a vector is calculated which belongs to a complementary subspace of the linear subspace when the test pattern vector is projected to the linear subspace. Next, a norm is calculated of the vector which belongs to the complementary subspace and similarity between the first image and the second image is measured based on the norm of the vector.

Thus, measuring of the similarity is hardly influenced by position deviation of a test pattern vector because the second fundamental pattern vectors of the second fundamental patterns which are displaced from the first fundamental pattern is used in addition to the first fundamental pattern vector. Use of a normalizing filter which normalizes the input images prevents change of brightness value of images due to illumination fluctuation. When the dimension of the pattern vectors are changed, a sensitivity of detecting defects can be varied because the ratio of the number of the elements of the vector, which indicates defects to the number of the elements of the vector, which indicates perfection is changed. When the data of the objects are transformed into images and a set of fundamental pattern vectors even for the objects expressed by numerical values which can not be compared directly, similarity can be obtained.

BRIEF DESCRIPTION OF THE DRAWINGS

FIG. 4 shows an example of the order of the elements in the pattern vector used in embodiment 1.

FIG. 5A shows a pattern of a wafer to be inspected which has 32 by 16 pixels and FIG. 5B shows 8 units of the wafer to be inspected at one time.

FIG. 14 is a block diagram showing the structure of the inspection apparatus as embodiment 4 of the invention.

FIG. 17 is a flow chart showing operational procedures of the apparatus of FIG. 16.

FIGS. 18A–18D are an example of a set of fundamental pattern vectors used in embodiment 5 of the invention.

FIG. 19 is a block diagram showing the structure of a conventional wafer surface defect inspection apparatus.

DETAILED DESCRIPTION OF THE PREFERRED EMBODIMENTS

Figure 1:
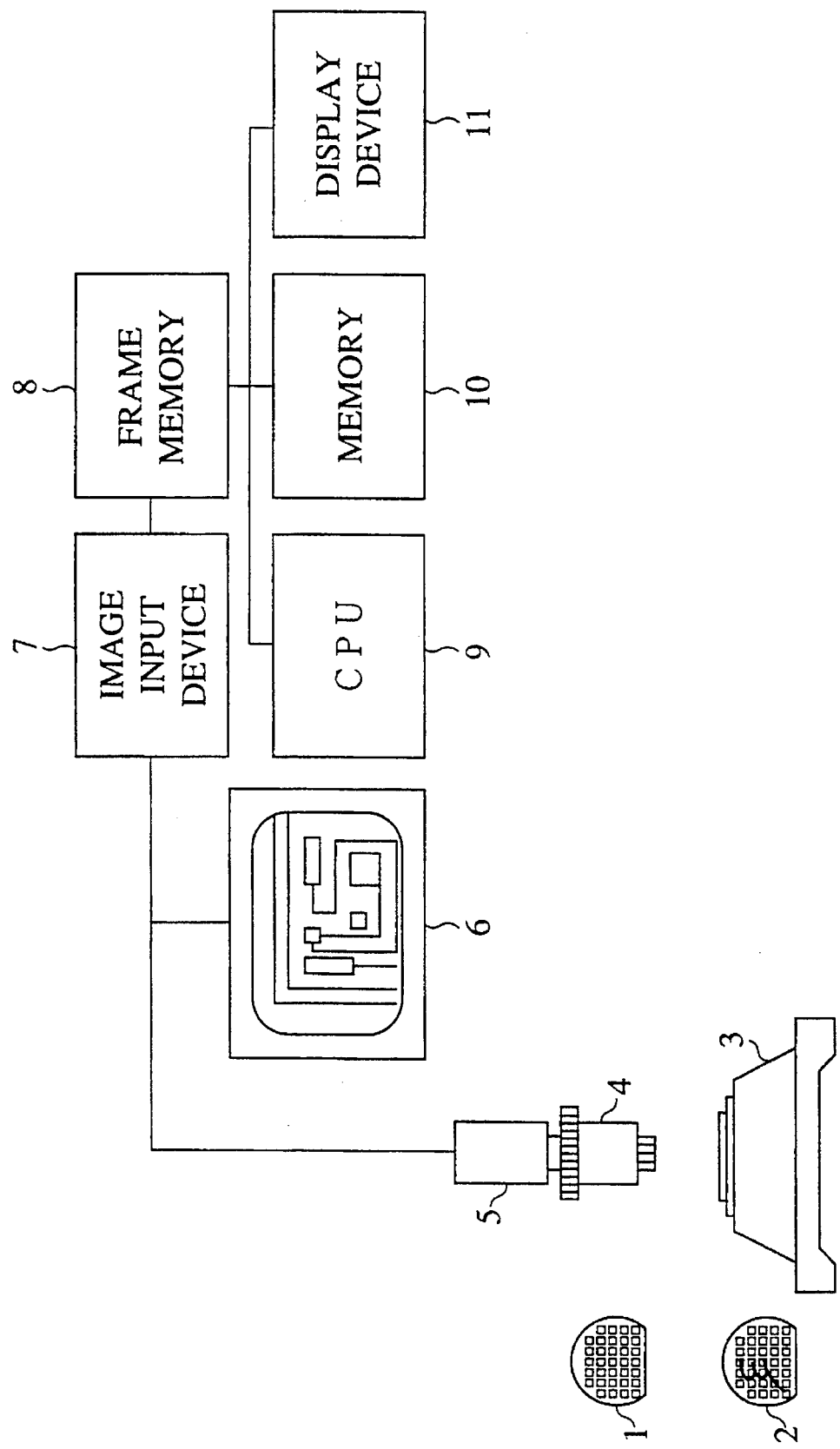
FIG. 1 is a block diagram showing the structure of the wafer defect inspection apparatus of embodiment 1, using pattern recognition.

The preferred embodiments of the present invention will be explained in detail referring to the drawing.
EMBODIMENT 1.

FIG. 1 is a block diagram showing a structure of the wafer defect inspection apparatus of embodiment 1 of the invention, using pattern recognition. In this figure, numeral 1 denotes a flawless wafer for preparing fundamental pattern vectors, numeral 2 denotes a wafer to be inspected with which test pattern vectors are prepared, numeral 3 denotes a moving mechanism which moves wafers 1 and 2, numeral 4 denotes a microscope which magnifies the image of the pattern of the surface of the wafers 1 and 2, numeral 5 denotes a CCD camera which takes in the images of a surface of wafers 1, 2 which are magnified by the microscope 4, numeral 6 denotes a display which monitors the image taken in by the CCD camera 5, numeral 7 denotes an image input device which performs Analog to Digital(A/D) conversion to the image signal from the camera 5, numeral 8 denotes a frame memory which stores the digitalized image signal, numeral 9 denotes a Central Processing Unit (CPU) which works out a similarity value between pattern of a flawless wafer 1 and a pattern of the wafer 2 which is to be inspected using pattern recognition procedures which will be explained later in detail, numeral 10 denotes a memory for storing a program and intermediate data of the processes, numeral 11 denotes a display which displays results of the inspection.

Figure 2:
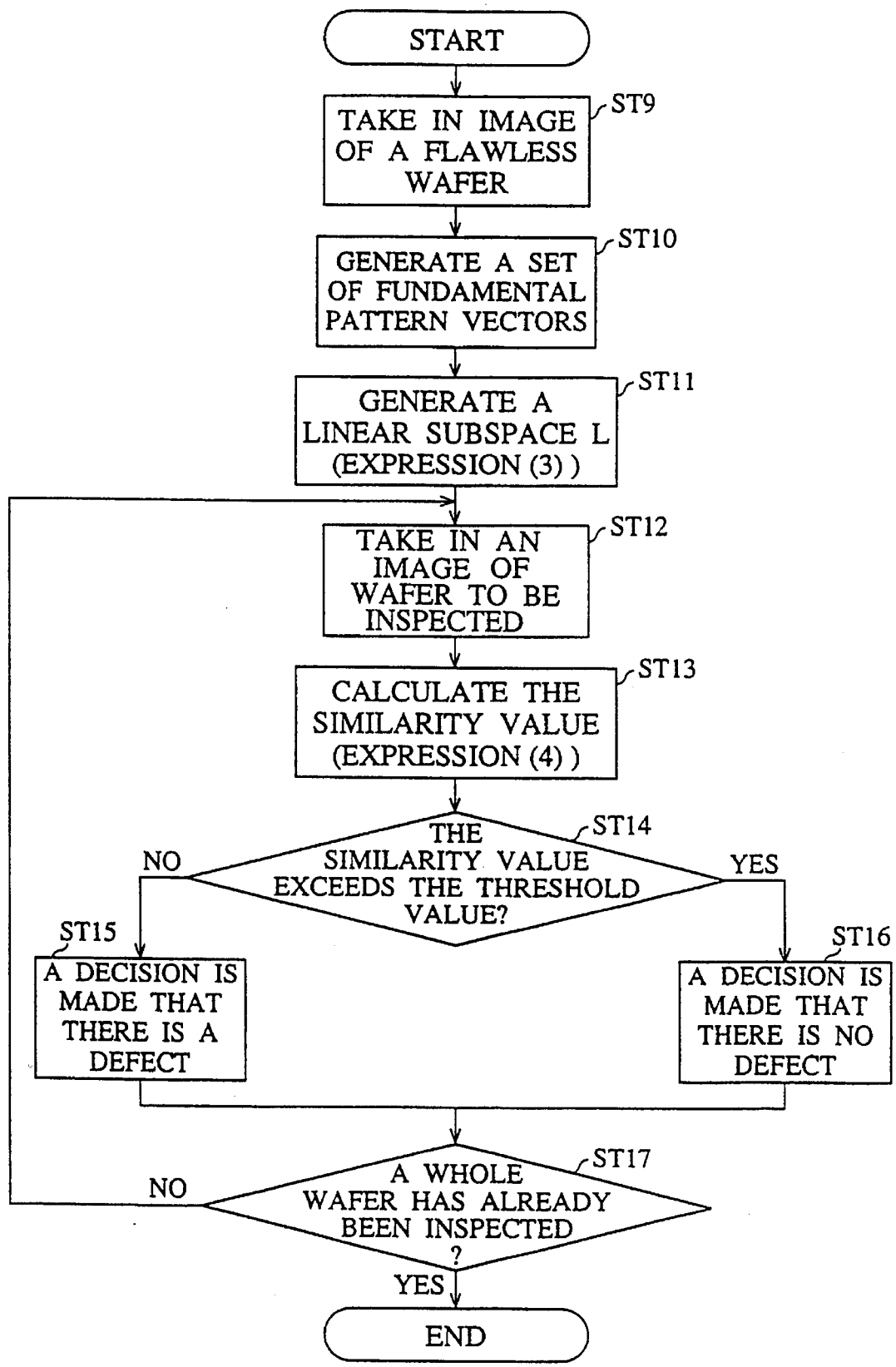
FIG. 2 is a flow chart showing operational procedures of this apparatus of FIG. 1.

Next, the general operation of the apparatus will be explained. FIG. 2 is a flow chart showing operational procedures of this apparatus. At first, the flawless wafer 1 is put on the moving mechanism 3. The CCD camera 5 scans the flawless wafer 1 and the image data are stored to the frame memory 8 (step ST9). On the basis of these data, a set of fundamental pattern vectors are generated (step ST10) and a linear subspace L is generated (step ST11) in a manner as described later. Next, the wafer 2 to be inspected is put on the moving mechanism 3. While the CCD camera 5 scans the whole surface of the wafer 2 to be inspected (step ST12), CPU 9 calculates a similarity value between patterns of the flawless wafer 1 and the patterns of the wafer 2 to be inspected, using pattern recognition in a manner as described later (step ST13) and compares the similarity value with a threshold value (step ST14). As a result of the comparison, when the similarity value is less than or equal to the threshold value, a decision is made that there is a defect on the surface of the wafer 2 (step ST15), and when the similarity value is greater than the threshold value, a decision is made that there is no defect on the surface of the wafer 2 (step ST16). These decisions are displayed on the display device 11. The above steps ST12 to ST16 are repeated until the inspection of the whole wafer 2 is finished (step ST17).

Figure 3A:
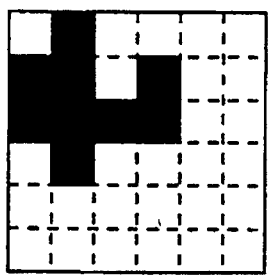
FIGS. 3A–3I are an example of fundamental patterns used in embodiment 1.
Figure 3B:
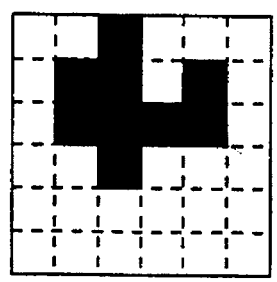
Figure 3C:
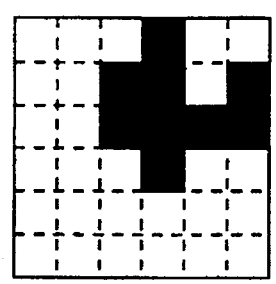
Figure 3D:
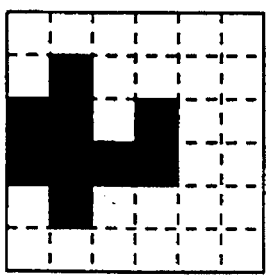
Figure 3E:
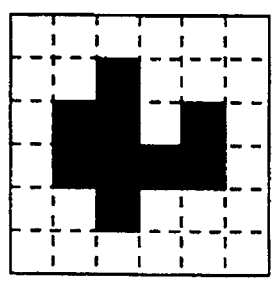
Figure 3F:
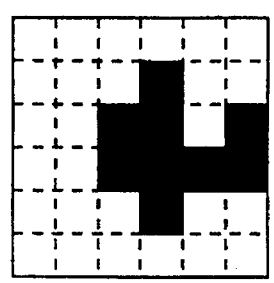
Figure 3G:
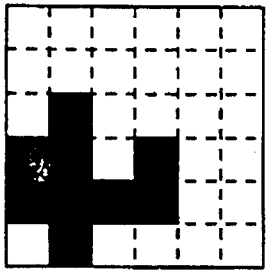
Figure 3H:
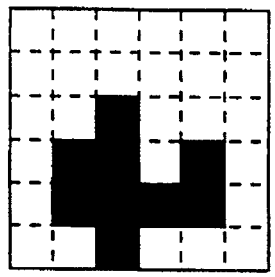
Figure 3I:
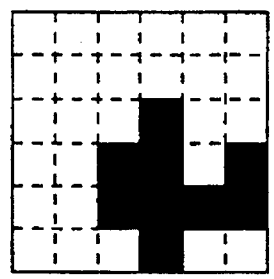

Next, the pattern recognition procedures will be explained which are performed by the program stored in the memory 10. At first, the procedure of making fundamental pattern vectors from image data in the step ST10 of FIG. 2 will be explained in detail, taking the patterns in FIG. 3 as an example, which shows a fundamental pattern on a basis place and fundamental patterns which are displaced in parallel to the fundamental pattern on the basis place. In this embodiment, eight fundamental patterns depicted in FIGS. 3A–3D and FIGS. 3F–3I are used in addition to the fundamental pattern on the basis place as depicted in FIG. 3E in order to allow the displacement of one pixel. Namely, these nine patterns are the fundamental pattern depicted in FIG. 3E and eight patterns which are displaced by one pixel in a upward, downward, rightward or leftward direction. Each pattern consists of 6 by 6 pixels and a 36-dimensional vector which has these 36 elements of brightness value in an appropriate order is defined as a pattern vector. Further, a set of pattern vectors of the above nine patterns are defined as a fundamental pattern vector set.

FIG. 4 is an example of the order of the elements in the pattern vector. As shown in this figure, brightness values can be arranged as elements of the pattern vector in the order the zigzag line 100 indicates. Let a brightness value of the white portion in the pattern of FIG. 3E be "0" and a brightness value of the black portion of the same pattern be "1", the fundamental pattern vector $X_5$ is as follows.

$$X_5 = [0, 0, 0, 0, 0, 0, 0, 0, 1, 0, 0, 0, 0, 1, 1, 0, 1, 0, 0, 1, \quad (1)$$
$$1, 1, 1, 0, 0, 0, 1, 0, 0, 0, 0, 0, 0, 0, 0, 0]^T \text{ wherein } T \text{ indicates a transposition.}$$

Thus, the fundamental pattern vector set is a set which consists of 9 fundamental pattern vectors $X_i$ (i=1, 2, ..., 9) expressed in the same way as the expression (1) corresponding to the 9 patterns of FIGS. 3A–3I.

The pattern recognition in the steps ST11 to ST13 wherein the above explained pattern vectors are used will be generally explained.

An n-dimensional fundamental pattern vector on the basis place is worked out from flawless wafer 1. Then, this fundamental pattern vector and m−1 fundamental pattern vectors which can be obtained by parallel displacement of the fundamental pattern vector on the basis place are taken into consideration. Let a linear subspace spanned by these m fundamental pattern vectors be L, this subspace L is expressed as follows. In the example of FIGS. 3A–3I, m=9 and n=36.

$$L=\{X_i \epsilon R_n | i=1, \ldots, m\} \quad (2)$$

On the other hand, a pattern of the wafer 2 to be inspected is expressed by an n-dimensional vector and this vector is called a test pattern vector X. The vector X is projected to the linear subspace L and the vector $X_c$ which belongs to the subspace $L_c$ complementary to the subspace L is worked out. If the vector X is similar to the fundamental pattern vectors, the vector X is nearly equal to one of the vectors Xi (i=1, 2, ..., 9) and the vector X is, for the most part, included in the subspace L. On the other hand, if the vector X has an element different from the one of the fundamental pattern vector, vector X is not included in the subspace L and there exists a vector $X_c$ which is included in the subspace $L_c$. Therefore, when the vector X is projected to the subspace L, the value $-|X_c|$ indicates a similarity value between the fundamental pattern vectors and a test pattern vector wherein $|X_c|$ shows the norm of vector $X_c$ and "–" shows a sign of minus. Namely, the lower the value $-|X_c|$ is, the lower the similarity is between the fundamental pattern vectors and a test pattern vector, and the more elements are in a test pattern vector, which are different from the elements of the fundamental pattern vectors. Therefore, a decision whether there is a defect or not can be made based on the value $-|X_c|$ which is calculated from the pattern of wafer 2 to be inspected.

Any kinds of norm can be used as long as the norm meets the definition of norm on mathematics. For example, Euclidean norm, $\{(X_c)^T X_c\}^{0.5}$ is a typical one.

When using an orthogonal projection as a projection, vector $X_c$ which belongs to the orthogonal complementary space $L_c$ of the vector X is worked out as follows.

1) Orthogonal vector sequence $H_i$(i=1, ..., m) which spans the linear subspace L is worked out based on the set of the m fundamental pattern vectors $X_i$ (i=1, ..., m) as shown in the following expression (3).

$$H_1 = X_1 \quad (3)$$

$$H_i = X_i - \sum_{k=1}^{i-1} \frac{(X_i, H_k)}{|H_k|^2} H_k$$

$$(i = 2, \ldots, m)$$

In the above expression (3), $(X_i, H_k)$ indicates an inner product of the vector $X_i$ and the vector $H_k$. In case of $|H_i|=0$ during the calculation of the expression (3), vector $X_i$ is discarded and the calculation continues for the vector $X_{i+1}$ because $X_i$ can be expressed by a linear combination of vectors $X_1$ to $X_{i-1}$.

2) A test pattern vector X is projected on an orthogonal basis to the subspace L and complementary vector $X_c$ is worked out by the following expression (4).

$$X_c = X - \sum_{k=1}^{m'} \frac{(X, H_k)}{|H_k|^2} H_k \quad (4)$$

In the above expression (4), m' denotes a number of vectors of the orthogonal vector sequence $H_i$. As stated in the above procedure 1), in case of $|H_i|=0$ during the calculation of the expression (3), m' is less than m and otherwise m'=m.

3) A decision whether there is a defect or not is made by evaluating the value $-|X_c|$ in step ST14 setting an appropriate threshold value $\epsilon$ as follows.

In case of $-|X_c| \leq \epsilon$, there is a defect (step ST15).

In case of $-|X_c| > \epsilon$, there is no defect (step ST16) \quad (5)

In order to show the effectiveness of the above mentioned pattern recognition procedures, results of a simulations and an experiment will be explained. At first, how degrees of defects affect the value $|X_c|$ will be shown.

FIG. 5A shows a pattern of a wafer to be inspected which has 32 by 16 pixels. Brightness of each pixel of the wafer pattern of FIG. 5A is expressed in 3 levels. Portions designated by slants A, B, and C indicate 0.25, 0.5, and 1.0 in brightness value. The brightness value of the background and outside of the wafer pattern is zero. The wafer pattern is divided into 8 areas such that one processing unit consists of 4 by 16 pixels as depicted in FIG. 5B and the dimension of the pattern vector is 64. The 8 test pattern vectors are separately inspected.

In this simulation, to allow the position displacement by one pixel for each processing unit, the 9 pattern vectors, 8 of which are displaced from the fundamental pattern on the basis place in upward, downward, leftward, and rightward directions by one pixel, are included in the fundamental pattern vector set.

Conditions of the simulation are set as follows.

(1) gradually varying the number of defective pixels from 1 to 10.

(2) changing the degree of defect by decreasing brightness value by 25, 50 and 75 percent. If the brightness value is zero, then the brightness value is increased by 25, 50, and 75 percent.

(3) A test pattern vector is made by the following procedures.

a) selecting one pattern vector randomly from the fundamental pattern vector set.

b) designating pixels of the selected pattern vector randomly.

c) generating a predetermined number of defects on the designated pixels.

Figure 6A:
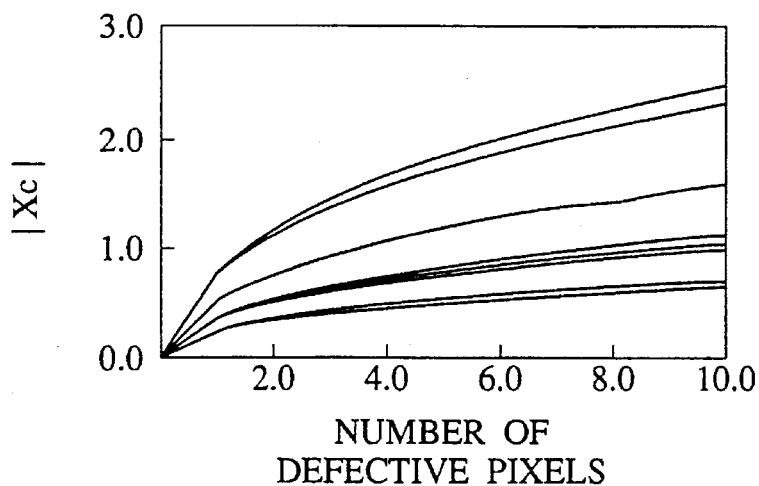
FIG. 6A, FIG. 6B, and FIG. 6C show relationship between the value $|X_c|$ and a number of defective pixels when the degree of defects is 75, 50, and 25 percent respectively.
Figure 6B:
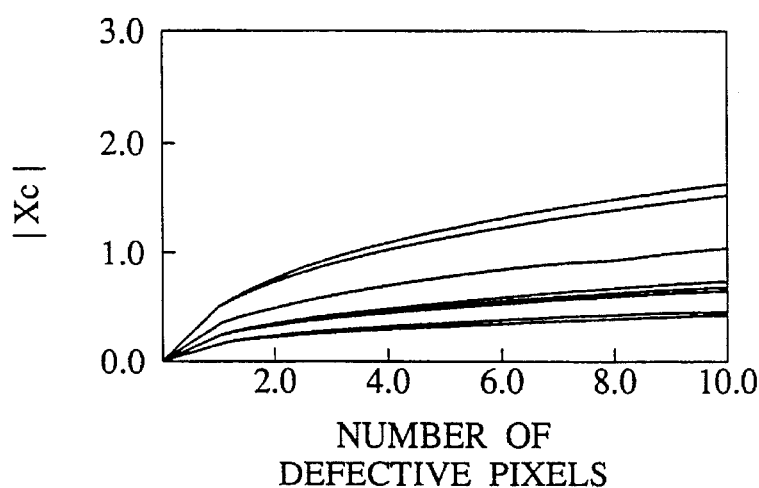
Figure 6C:
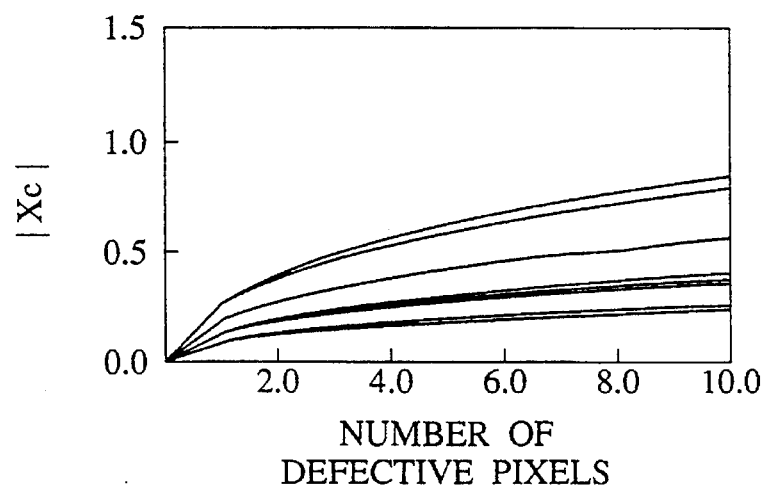

FIG. 6A, FIG. 6B, and FIG. 6C shows relationships between the value $|X_c|$ and number of defective pixels when the degree of defect is 75, 50, and 25 percent respectively. The 8 curves in each figure correspond to 8 test pattern vectors. As understood from the figures, the higher the degree of the defect is, the greater the value $|X_c|$ is. This feature is independent on test pattern vectors. This result shows that existence of defects can be detected by evaluating the value $|X_c|$.

Next, the effect that the above pattern recognition is not affected by position deviation of pattern will be explained. The following is an experiment using real images of the wafer in order to investigate how much a position deviation influences the value $|X_c|$. In this experiment, 8 by 128 pixels (total 1024 pixels) is set as one processing unit. In other words, the dimension of the pattern vector is 1024. The fundamental pattern vector set consists of 25 fundamental pattern vectors, 24 of which are displaced from the fundamental pattern vector on the basis place by one or two pixels. The 25 pattern vectors are made based on the average image of 100 image data. As the same kind of flawless wafer is moved in upward, downward, leftward, and rightward directions up to 4 µm, the value $|X_c|$ is calculated every 0.2 µm. In this experiment, the width of one pixel is approximately 1 µm.

Figure 7:
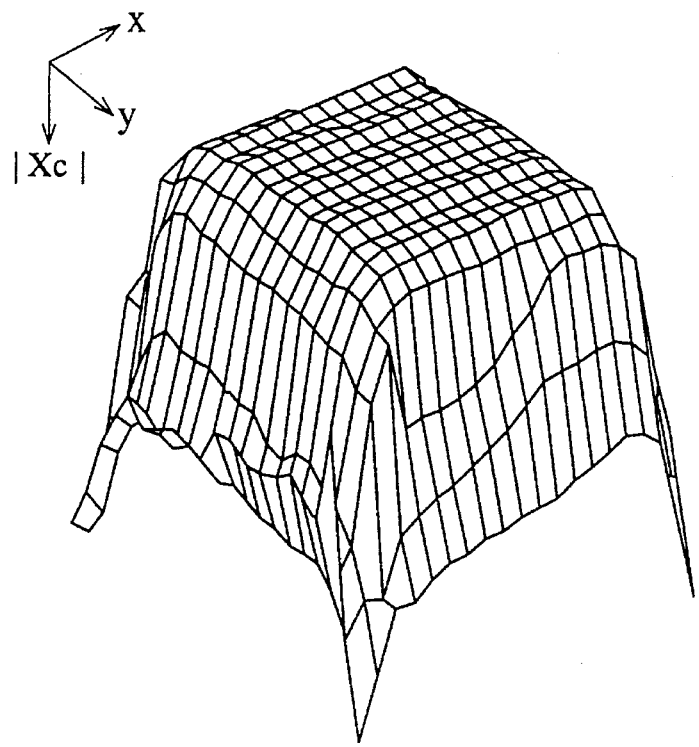
FIG. 7 shows relationship between the positions of the wafer which is moved and the value $|X_c|$ corresponding to the positions.

FIG. 7 shows relationship between the positions of the wafer which is moved in the above experiment and the value $|X_c|$ corresponding to the positions. In this figure, the greater the value $|X_c|$ becomes, the lower it is plotted for ease of displaying the relationship. As is clear from this figure, value $|X_c|$ is kept low when the wafer is in the range which can be covered by fundamental pattern vectors (±2 pixel displacement) and the value $|X_c|$ increases according as the wafer is displaced outside of the range. Thus, when the wafer is placed within the flat square portion of FIG. 7, even if the wafer is moved between the any two of the fundamental patterns, the inspection is not affected by the deviation of the wafer position.

Figure 8:
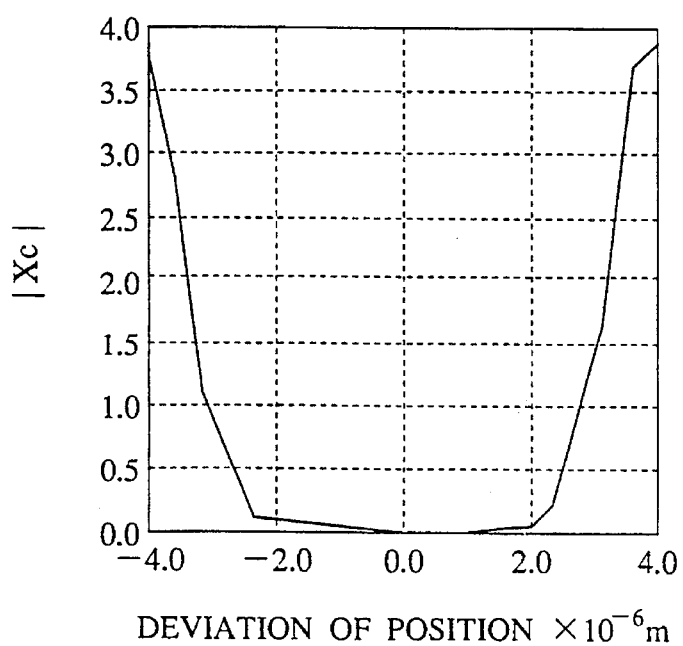
FIG. 8 is a graph showing a cross section of the graph shown in FIG. 7.

FIG. 8 is a graph Showing a cross section of the graph shown in FIG. 7. In this figure, X axis shows a deviation of the position of the wafer and Y axis shows the value $|X_c|$. As explained above, this graph shows the case in which 2 pixel deviation is taken into consideration. When the position deviation is taken into consideration, the value $|X_c|$ is kept low in the range which can be covered by pattern vectors of the fundamental pattern vector set. Thus, detection of the defects can be carried out without being affected by position deviation.

As explained above, in this embodiment, a plurality of pattern vectors which are displaced from the fundamental pattern vector on the basis place are included in the fundamental pattern vector set. Thus, influence of position deviation of the wafer does not appear owing to the characteristics of linear dependency of vectors. Therefore, precise pattern recognition can be performed in the permissible range of position deviation.

Generally, there exist at most n basic vectors in n-dimensional vector space. Because m vectors are used to span the subspace L, remaining n–m vectors can be used as vectors which express elements of defects. If n and m are determined such that n–m is large, the probability is low that a test pattern including a defect is included in the subspace L which can be expressed by linear combination of orthogonal vector sequence $H_i$. Thus, a number of unrecognizable defects decreases. Therefore, when the number m of pattern vectors in the fundamental pattern vector set is sufficiently smaller than the dimension n of the pattern vector, probability of wrong recognition decreases and recognition can be more precisely performed.

Further, as depicted in FIGS. 6A–6C, the value $|X_c|$ monotonously increases according as defective pixels increase or vector elements which indicate defects increase. According to this fact, if the dimension of pattern vectors is large, a defect detection sensitivity becomes low because a ratio of defective elements to the whole vector is small. On the other hand, if the dimension of pattern vectors is small, a defect detection sensitivity becomes high. Namely, sensitivity of the similarity detection can be varied by changing the number of dimension of the pattern vectors.

Furthermore, in the expression (1), the brightness values are expressed by two values "0" or "1", however, brightness value can be expressed by analogue amount.

EMBODIMENT 2.

In addition to the pattern recognition of the embodiment 1, a normalization filter which has a linear or non-linear input-output relationship may be employed in the image input device 7 of FIG. 1. The brightness value of each pixel passes through the normalization filter and the output signal from the normalization filter is used as an element of the pattern vector. For example, a normalization filter which works in such a way that the maximum brightness value corresponds to "1" and the minimum brightness value corresponds to "0" is a typical one. In steps ST9, ST12 of FIG. 2, after the images of flawless wafer 1 and wafer 2 to be inspected are taken in, the image signals passes through the normalization filter and the output image signals are stored in the frame memory 8.

If pattern recognition is performed in the same way as the embodiment 1 using pattern vectors having the elements which pass through the normalization filter, influence of a contrast change in image due to fluctuation of the illumination can be avoided.

EMBODIMENT 3.

Another embodiment of pattern recognition system of the present invention will be explained when it is applied to the verification system of Computer Aided Design (CAD) data.

Figure 9:
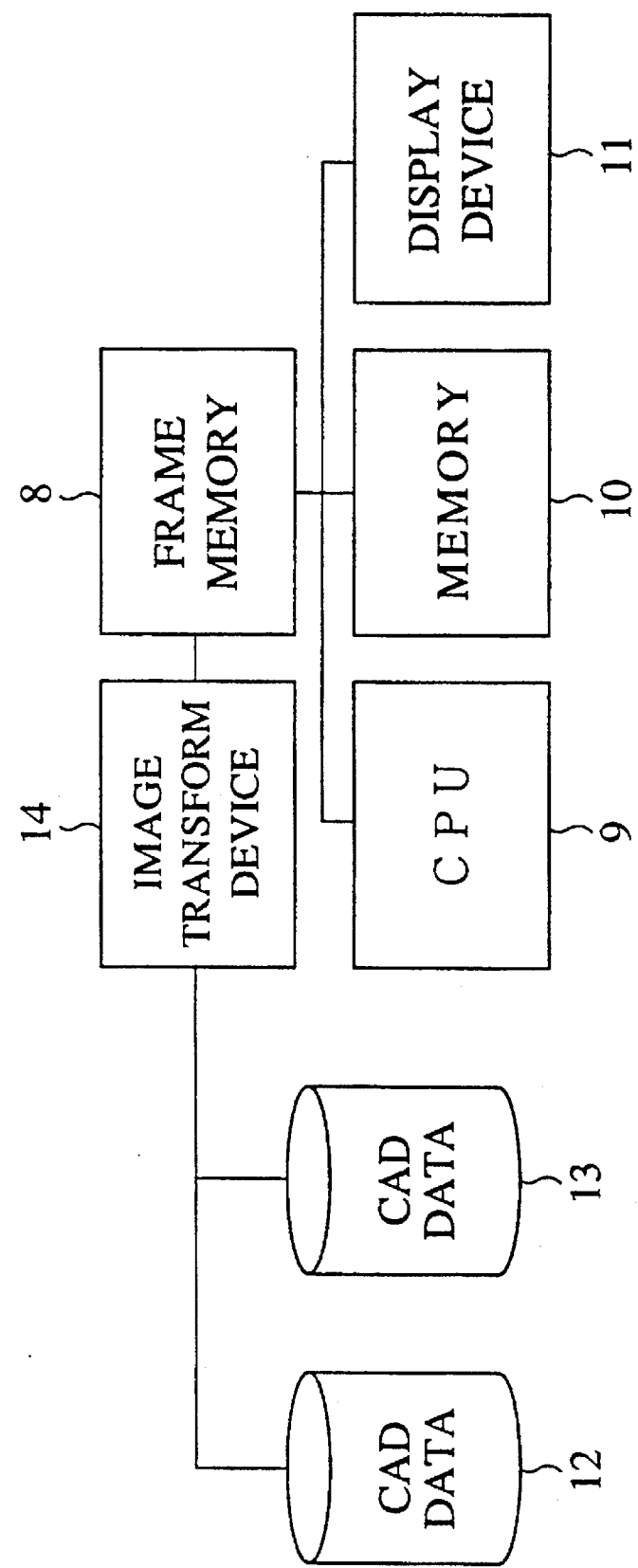
FIG. 9 is a block diagram showing the structure of the verification system as embodiment 3 of the invention.

FIG. 9 is a block diagram showing the structure of the verification system. In this figure, numeral 12 denotes CAD basis data having coordinate resolution value 1, numeral 13 denotes CAD data to be verified, which has coordinate resolution value 0.5, numeral 14 denotes a image transform device which transforms CAD data 12 and 14 into images, numeral 8 denotes a frame memory for storing transformed image, numeral 9 denotes a CPU which calculates similarity value between an image transformed from CAD data 12 and an image transformed from CAD data 13 using images stored in frame memory 8, numeral 10 denotes a memory for storing a calculation program and intermediate data of the calculation process, numeral 11 denotes a display device which displays a result of the verification.

Figure 10:
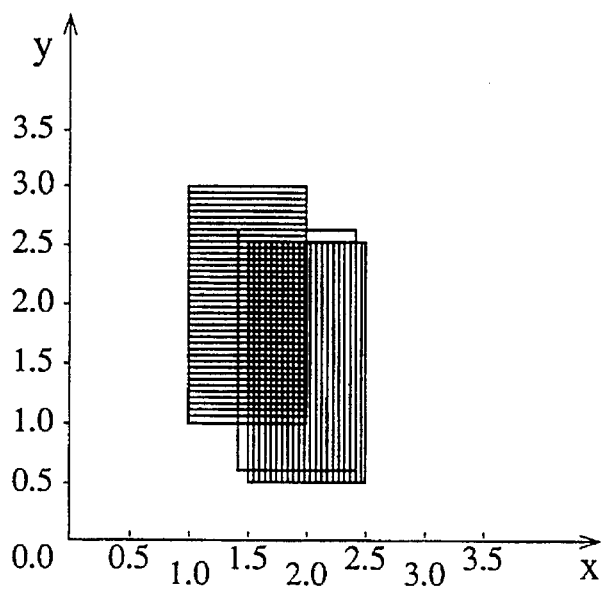
FIG. 10 shows how a figure is expressed in different resolution CAD data in embodiment 3 of the invention.

A figure is expressed by numerical data which indicate the coordinates of the vertices, lengths of lines, and curvatures of curves and so forth in CAD data. How a figure is expressed in different resolution CAD data will be explained using FIG. 10. As depicted in this figure, a rectangle having 4 vertices (1.4, 0.6), (2.4, 0.6), (2.4, 2.6), (1.4, 2.6) is taken as an example. In order to express this figure as CAD data, it is necessary to round the 4 coordinates according to the coordinate resolution value of each CAD data. In this embodiment, coordinate values are changed to the nearest value of the each resolution. In the CAD data 12 whose coordinate resolution is "1", the above 4 vertices are expressed by (1, 1), (2, 1), (2, 3), (1, 3) and this rectangle is depicted in FIG. 10, which is hatched by horizontal lines. On the other hand, in the CAD data 13 whose coordinate resolution is "0.5", the above 4 vertices are expressed by (1.5, 0.5), (2.5, 0.5), (2.5, 2.5), (1.5, 2.5), which is hatched by vertical lines.

Apparently, coordinates of the CAD data 12 are different from coordinates of the CAD data 13. Thus, identity or similarity can not be judged only by comparing coordinates of vertices. Thus, verification is performed in the following procedures. Now, CAD data 12 is regarded as basis data and CAD data 13 is regarded as data to be inspected.

Figure 12:
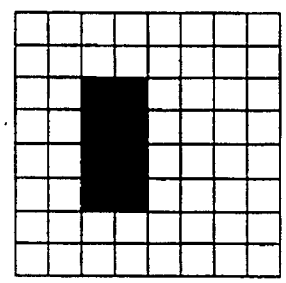
FIG. 12 shows an image obtained from pre-processed CAD data 12 having resolution value 1.
Figure 11:
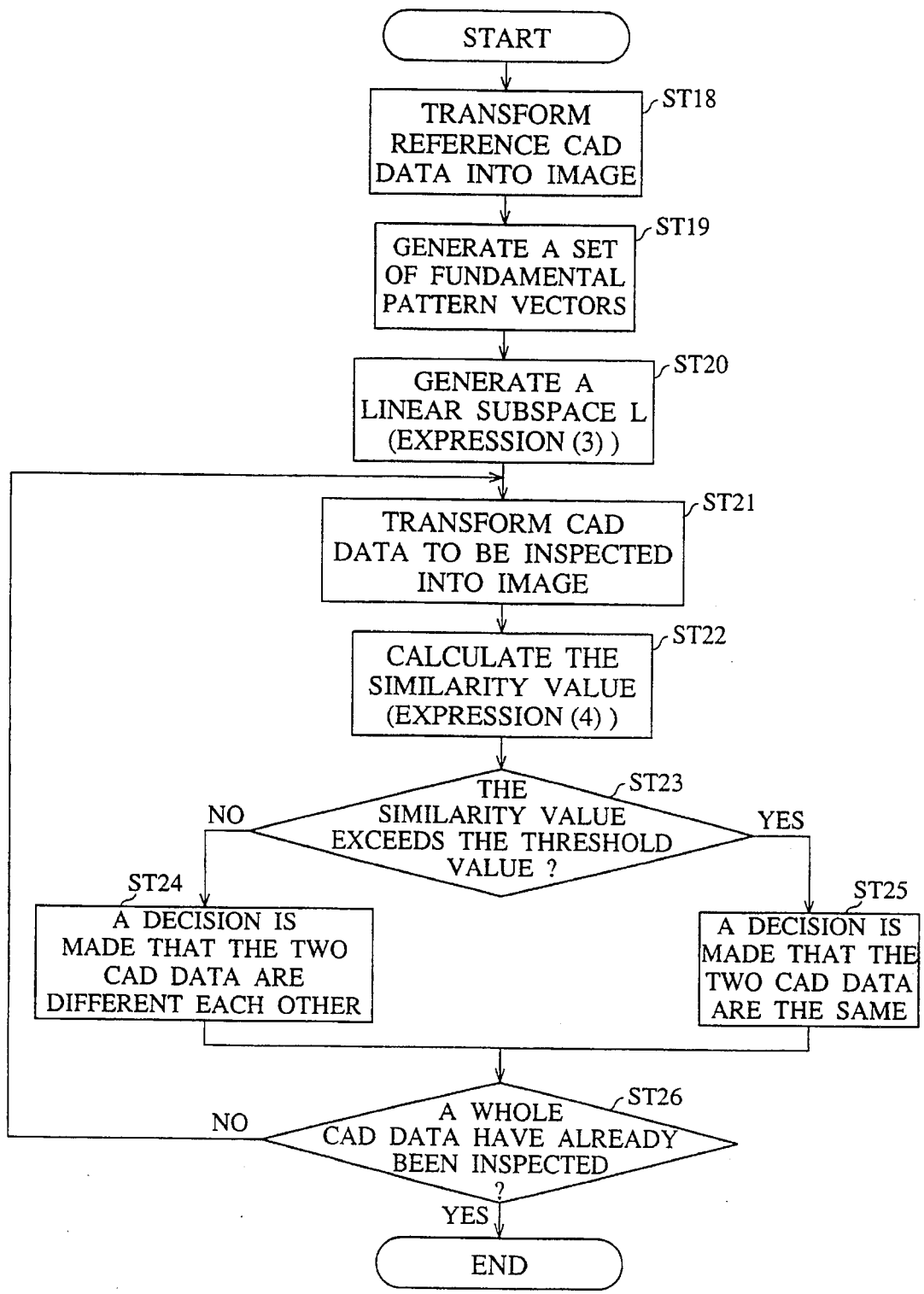
FIG. 11 is a flow chart which shows operational procedures of the pattern recognition of embodiment 3.

FIG. 11 is a flow Chart which shows operational procedures of the pattern recognition of this embodiment. At first, CAD data 12 are inputted to image transform device 14 and the data 12 are transformed into image (step ST18). The image is pre-processed according to applications of CAD data. As pre-processing, two of vertices are connected with a line and the portion surrounded by lines is painted, for example. By this processing, the image depicted in FIG. 12 is obtained. Then, the fundamental pattern vector of the fundamental pattern on the basis place is prepared and a fundamental pattern vector set is obtained which includes fundamental pattern vectors of the pattern vectors displaced from the fundamental pattern on the basis place in addition to the fundamental pattern vector on the basis place in the same way as the embodiment 1 (step ST19). Using the fundamental pattern vector set, a linear subspace L is generated (step ST20).

Figure 13:
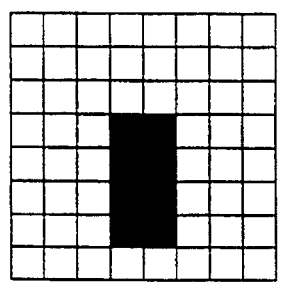
FIG. 13 shows an image obtained from pre-processed CAD data 13 having resolution value 0.5.

Next, the same pre-processing is carried out to the CAD data 13 to be verified and the image depicted in FIG. 13 is obtained. From this image, a test pattern vector is prepared (step ST21). With this result, a similarity value is calculated by CPU 9 in the pattern recognition procedures described in the embodiment 1 using expression (4). The similarity value is compared with a threshold value (step ST23). If the similarity value is less than or equal to the threshold value, a decision is made that the two CAD data are different from each other (step ST24). If the similarity value is greater than the threshold value, a decision is made that the two CAD data are the same (step ST25). Steps 21 to 26 are repeated until the verification of all the CAD data is finished (step ST26). As explained above, in this embodiment, a plurality of patterns which are displaced from the fundamental pattern on the basis place are included in the fundamental pattern vector set. Thus, influence of position deviation does not appear owing to the characteristics of linear dependency of vectors. Therefore, a precise recognition can be performed in the permissible range of position deviation. Therefore, similarity between subjects which are expressed by numeric values which can not be compared with each other directly can be obtained.

EMBODIMENT 4.

Pattern recognition of this invention will be explained when it is applied to an inspection apparatus which inspects the presence of solder on an electrode on a semiconductor wafer. In this embodiment, fundamental pattern vectors are produced from the image having a defect and similarity is calculated between the fundamental pattern vectors and test pattern vectors.

FIG. 14 is a block diagram showing the structure of the inspection apparatus. In this figure, numeral 15 denotes a defective wafer on which there is no solder, numeral 16 denotes a wafer to be under inspection of presence of solder, numeral 3 denotes a moving mechanism which moves wafers 15 and 16, numeral 4 denotes a microscope which magnifies the pattern image of the surface of wafers 15 and 16, numeral 5 denotes a CCD camera which takes in the image of the wafer magnified by the microscope 4, numeral 6 denotes a display which monitors the image taken in by the CCD camera 5, numeral 7 denotes an image input device which performs A/D conversion to the image signal from the camera 5, numeral 8 denotes a frame memory for storing the digitalized image signal, numeral 9 denotes a CPU which works out a similarity value between pattern of a defective wafer 15 and a pattern of the wafer 16 which is to be inspected using pattern recognition procedures which will be explained later in detail, numeral 10 denotes a memory for storing a program and intermediate data of the processes, numeral 11 denotes a display which displays the results of the inspection.

Figure 15:
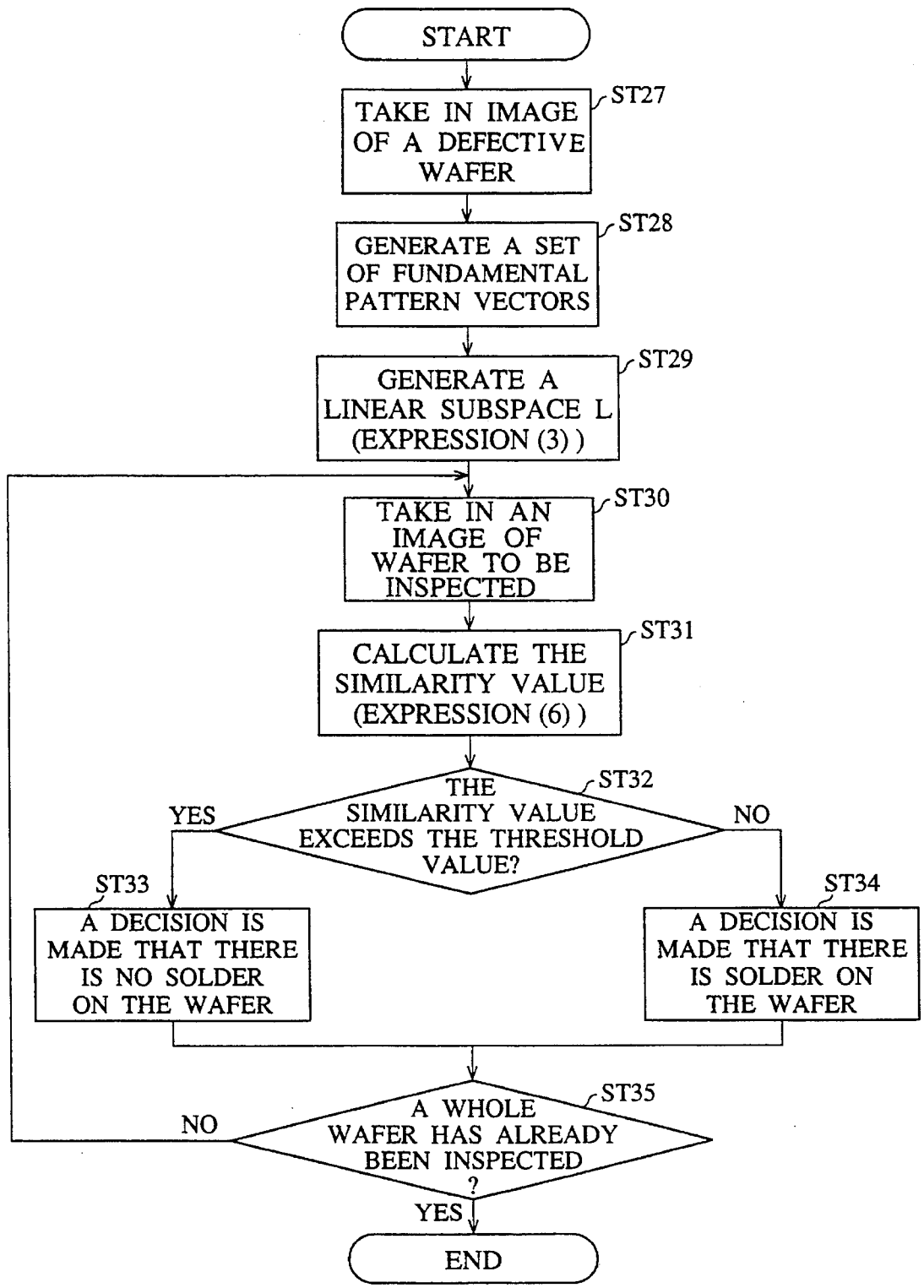
FIG. 15 is a flow chart showing operational procedures of this apparatus of FIG. 14.

FIG. 15 is a flow chart showing operational procedures of this apparatus. At first, the defective wafer 15 is put on the moving mechanism 3. The CCD camera 5 scans the defective wafer 15 and stores the image data to the frame memory 8 (step ST27). On the basis of these data, a set of fundamental pattern vectors are generated as described in the embodiment 1 (step ST28). A linear subspace L is generated using the expression (3) (step ST29). Next, the wafer 16 to be inspected is put on the moving mechanism 3. While the CCD camera 5 scans the whole surface of the wafer 16 to be inspected (step ST30), CPU 9 calculates a similarity value between patterns of the defective wafer 15 and the patterns of the wafer 16 to be inspected in a manner as described later (step ST31) and compares the similarity value with a threshold value (step ST32). As a result of the comparison, when the similarity value is greater than the threshold value, a decision is made that the wafer 16 does not have solder on it and the wafer is defective (step ST33), and when the similarity value is less than or equal to the threshold value, a decision is made that the wafer 16 has solder on it and the wafer is flawless (step ST34). These decisions are displayed on the display device 11. The above steps ST30 to ST34 are repeated until the inspection of the whole wafer 16 is finished (step ST35).

Next, the pattern recognition procedures will be explained in further detail which are performed by the program stored in the memory 10. At first, in step ST28, the fundamental pattern on the basis place as to defective wafer 15 is expressed by a n-dimensional vector. Next, in step ST28, a fundamental pattern vector set is worked out which includes the fundamental pattern vector on the basis place and m−1 fundamental pattern vectors of the pattern vectors which are displaced from the fundamental pattern on the basis place. Let L be a linear subspace which is spanned by the m fundamental pattern vectors (step ST29). This linear subspace L is expressed by the expression (2).

On the other hand, a pattern of the wafer 16 to be inspected is expressed by an n-dimensional vector and this vector is called a test pattern vector X. The vector X is projected to the linear subspace L and vector $X_h$ which belongs to the subspace L is worked out. If the vector X is similar to the fundamental pattern vectors, the vector X is nearly equal to one of the vectors Xi and the vector X is, for the most part, included in the subspace L. Therefore, when the vector X is projected to the subspace L, the value $|X_n|$ indicates a similarity value between the fundamental pattern vectors and a test pattern vector. Namely, the greater the value $|X_h|$ is, the higher the similarity is between the fundamental pattern vectors and a test pattern vector X. Therefore, the presence of solder can be judged by calculating $|X_h|$ for the wafer 16 to be inspected. Any kinds of norm can be used as long as the norm meets the definition of norm on mathematics. For example, Euclidean norm, $\{(X_h)^T X_h\}^{0.5}$ is a typical one.

When using an orthogonal projection as a projection, vector $X_h$ which belongs to the subspace L of the vector X is worked out as follows.

1) Orthogonal vector sequence $H_i$ (i=1, . . . , m) which spans the linear subspace L is worked out based on the set of the m fundamental pattern vectors $X_i$ (i=1, . . . ,m) as shown the following expression (3).

2) A test pattern vector X is projected on an orthogonal basis to the subspace L and vector $X_h$ is worked out by the following expression (6).

$$X_h = \sum_{k=1}^{m'} \frac{(X, H_k)}{|H_k|^2} H_k \qquad (6)$$

In the above expression (6), m' denotes a number of vectors of the orthogonal vector sequence $H_i$. In case of $|H_i|=0$ during the calculation of the expression (3), m' is less than m and otherwise m'=m.

3) A decision whether there is a defect or not is made by evaluating the value $|X_h|$ in step ST32 setting an appropriate threshold value ϵ as follows.

In case of $|X_h| \leq \epsilon$, there is solder on the wafer 16 and the wafer is flawless (step ST34).

In case of $|X_h| > \epsilon$, there is no solder on the wafer 16 and the wafer 16 is defective (Step ST33).

As explained above, in this embodiment, a plurality of patterns which are displaced from the fundamental pattern vector on the basis place are included in the fundamental pattern vector set. Thus, influence of position deviation of the wafer does not appear owing to the characteristics of linear dependency of vectors. Therefore, a precise recognition can be performed in the permissible range of position deviation.

EMBODIMENT 5.

Another embodiment of the invention will be explained when it is applied to an outward appearance inspection apparatus which inspects outward appearance of bolts. When the outward appearances of bolts are inspected, all bolts are not placed in the same direction. This embodiment concerns a pattern recognition wherein directions of the subjects to be inspected are not the same.

Figure 16:
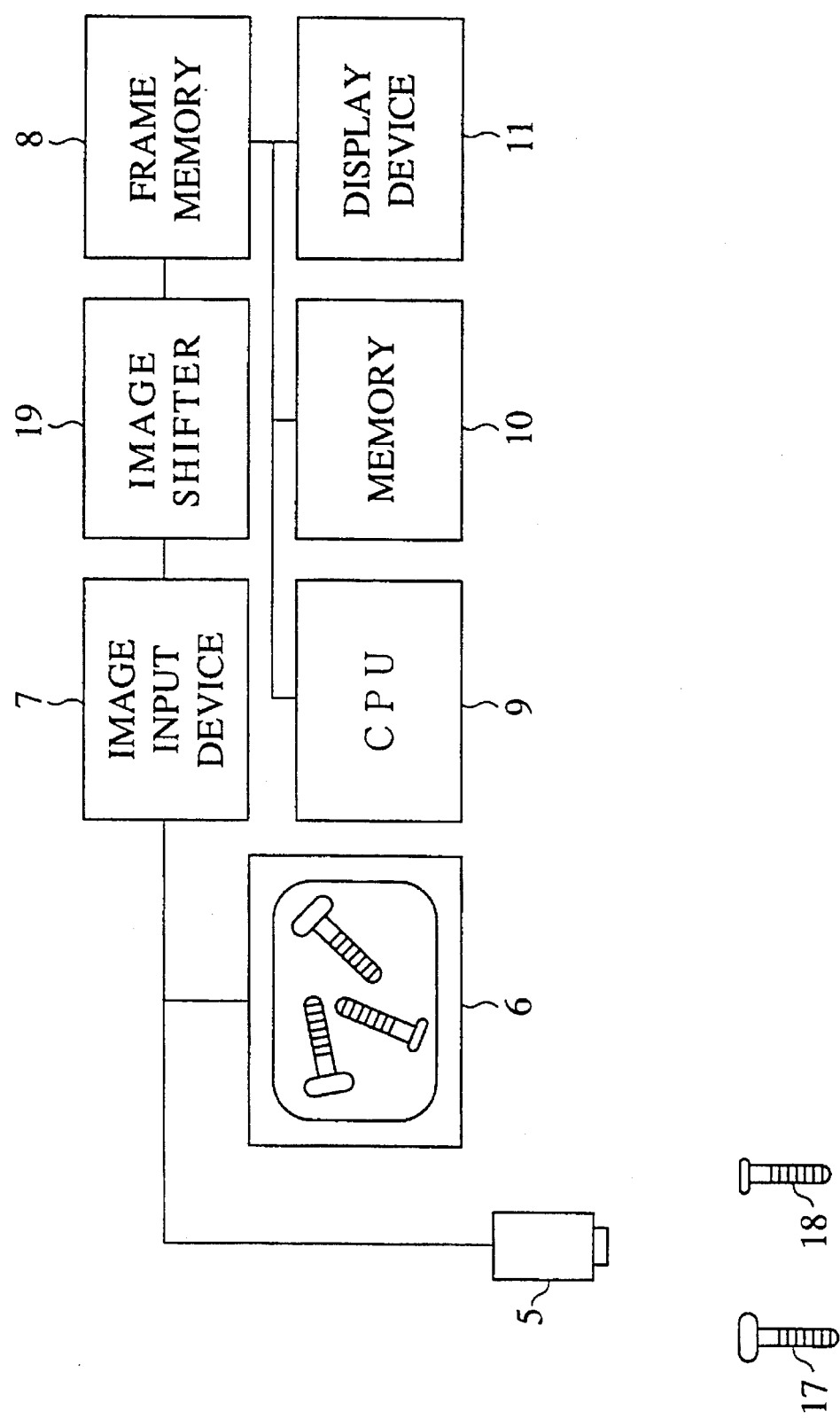
FIG. 16 is a block diagram showing the structure of the outward appearance inspection apparatus according to embodiment 5 of the invention.
Figure 20:
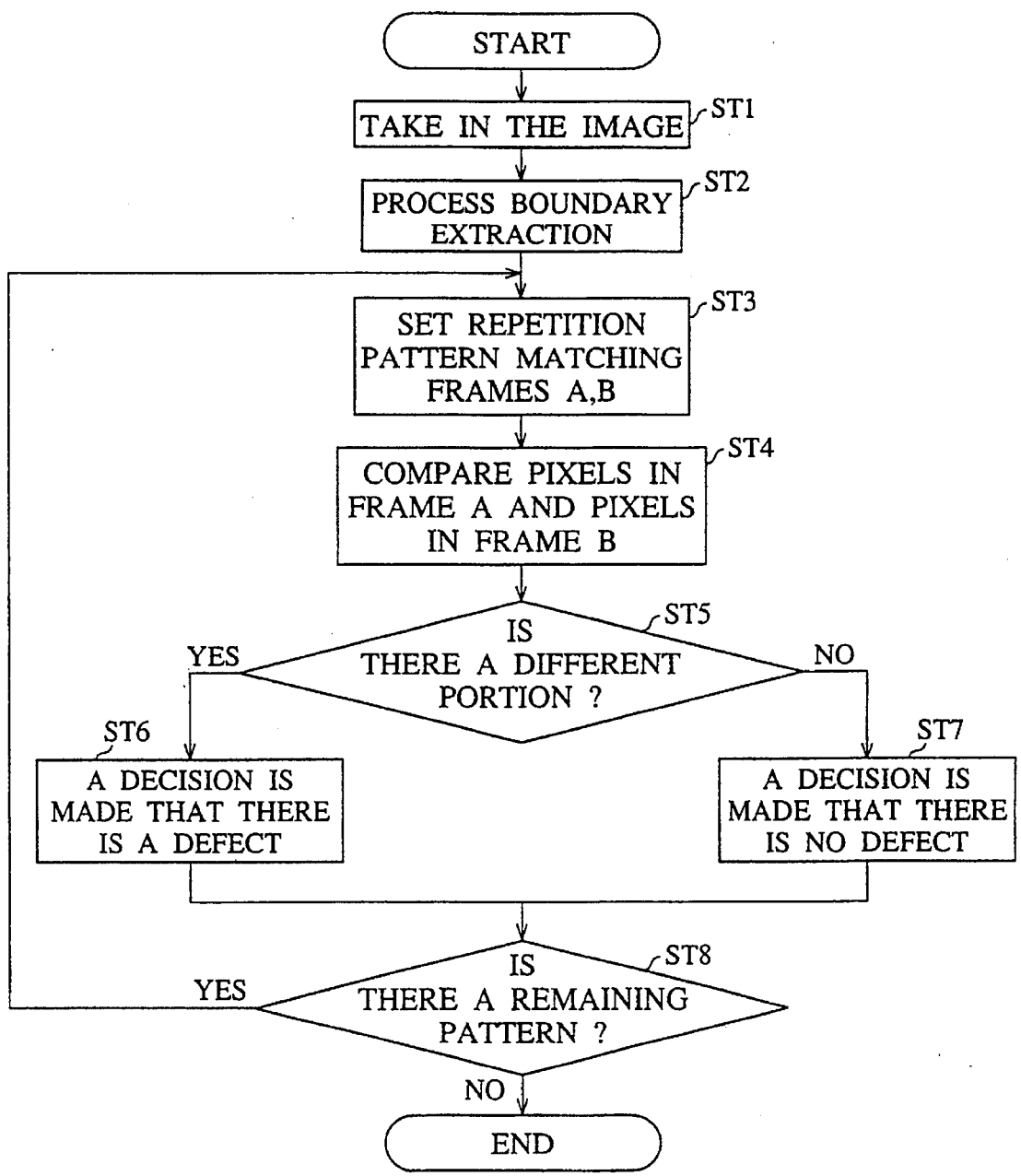
FIG. 20 is a flow chart showing the operational procedures of the apparatus of FIG. 19.

FIG. 16 is a block diagram showing the structure of the outward appearance inspection apparatus according to this embodiment. In this figure, numeral 17 denotes a flawless bolt for preparing fundamental pattern vectors, numeral 18 denotes a bolt to be inspected, numeral 5 denotes a CCD camera which takes in the images of bolts 17 and 18, numeral 6 denotes a display which monitors the image taken in by the CCD camera 5, numeral 7 denotes an image input device which performs A/D conversion to the image signal from the camera 5, numeral 19 denotes an image shifter which finds each bolt image from digitalized image by the image input device 7 and displace the bolt in parallel such that the barycenter of image is set on a designated point, numeral 8 denotes a frame memory storing the shifted image, numeral 9 denotes a CPU which works out a similarity value between pattern of the flawless bolt 17 and a pattern of the bolt 18 which is to be inspected using pattern recognition procedures which will be explained later in detail, numeral 10 denotes a memory for storing a program and intermediate data of the processes, numeral 11 denotes a display which displays the results of the inspection.

FIG. 17 is a flow chart showing operational procedures of the above apparatus. At first, the image data of the flawless bolt 17 is shifted such that the barycenter of the bolt is set to the designated point (step ST36). Based on the shifted image data, a fundamental pattern vector set is produced in the same way as in the embodiment 1 (step ST37). Then, a linear subspace L is worked out based on this fundamental pattern vector set (step ST38). Next, the image of the bolt 18 to be inspected is inputted to the image input device and the image is shifted by the image shifter 19 such that the barycenter of the image is set to the designated point. A similarity value between a pattern of the flawless bolt 17 and a pattern of the bolt 18 to be inspected is calculated as explained in the embodiment 4 using the expression (6) (step ST40). The similarity value is compared with a threshold value (step ST41). If the similarity value is less than or equal to the threshold value, a decision is made that the bolt 18 is defective (step ST42). If the similarity value is greater than the threshold value, a decision is made that the bolt 18 is flawless (step ST43). The results of these decisions are displayed by display device 11. The steps 39 to 43 are repeated until inspections of all the bolt are finished (step ST44).

Next, the pattern recognition procedures will be explained in further detail which are performed by the program stored in the memory 10, taking an example of pattern vectors depicted in FIGS. 18A–18D. In order to allow rotation displacement, this embodiment uses a fundamental pattern on the basis place depicted in FIG. 18A and 3 fundamental patterns which are rotated every 90 degrees depicted in FIGS. 18B–18D. Each pattern consists of 6 by 6 pixels and a 36-dimensional vector which has 36 elements of brightness values of these 6 by 6 pixels in an appropriate order is defined as a pattern vector. Further, a fundamental pattern vector set consists of 4 fundamental pattern vectors of the fundamental patterns depicted in FIGS. 18A–18D. Based on these 4 fundamental pattern vectors, a value $|X_h|$ is worked out as explained in the embodiment 4.

In this embodiment, a defect inspection can be done for bolts which are placed in any directions because pattern recognition of this embodiment is not affected by rotational displacement of patterns.

What is claimed is:

1. A pattern recognition method for comparing a first image including a fundamental pattern, to a second image including a test pattern, to detect a match between the test pattern and the fundamental pattern, the method comprising the steps of:

producing a first signal representative of said first image;

producing a second signal representative of said second image;

generating a set of data structures that defines a set of vectors based upon said first signal, said set of vectors including a first vector indicative of the fundamental pattern of the first image disposed in a first position and a plurality of second vectors indicative of the fundamental pattern of the first image disposed in a plurality of respective different positions from the first position;

generating a linear subspace data structure that defines a linear subspace spanned by the first vector and the plurality of second vectors;

generating a test pattern data structure that defines a test pattern vector based upon said second signal, said test pattern data structure being indicative of the second image;

projecting the test pattern vector to the generated linear subspace to produce a third vector which belongs to a complementary subspace of the linear subspace;

generating a norm signal based upon the third vector which belongs to the complementary subspace; and determining if the fundamental pattern of the first image matches the test pattern of the second image based on the norm signal.

2. The pattern recognition method according to claim 1, wherein the plurality of second vectors includes N second vectors, and each of the first vector and the plurality of second vectors has a dimension greater than N+1.

3. The pattern recognition method according to claim 1, wherein the step of determining includes the step of:

comparing the norm signal to a sensitivity threshold, wherein the sensitivity threshold is based upon a number of dimensions of the set of vectors.

4. The pattern recognition method according to claim 1, wherein the fundamental pattern of the first image is an outward appearance of a structure of a flawless wafer, wherein the test pattern of the second image is an outward appearance of a structure of a wafer under test, and wherein the step of determining includes a step of detecting a defect in the structure of the wafer under test.

5. The pattern recognition method according to claim 1, wherein the step of producing the first signal further comprises a step of normalizing the first image so that the first signal represents a normalized first image, and the step of producing the second signal further comprises a step of normalizing the second image so that the second signal represents a normalized second image.

6. The pattern recognition method according to claim 1, wherein the step of generating the set of data structures includes the step of:

providing the plurality of second vectors indicative of the first image having pixels of the fundamental pattern displaced in parallel relative to the first position.

7. The pattern recognition method according to claim 1, wherein the step of generating the set of data structures includes the step of:

providing the plurality of second vectors indicative of the first image having pixels of the fundamental pattern displaced rotationally with respect to the first position.

8. A pattern recognition method for comparing a first image including a fundamental pattern, to a second image including a test pattern, to detect a match between the test pattern and the fundamental pattern, the method comprising the steps of:

producing a first signal representative of said first image;

producing a second signal representative of said second image;

generating a set of data structures that defines a set of vectors based upon said first signal, said set of vectors including a first vector indicative of the first pattern of the first image disposed in a first position and a plurality of second vectors indicative of the first pattern of the first image disposed in a plurality of respective different positions from the first position;

generating a linear subspace data structure that defines a linear subspace spanned by the first vector and the plurality of second vectors;

generating a test pattern data structure that defines a test pattern vector based upon said second signal, said test pattern data structure being indicative of the second image;

projecting the test pattern vector to the generated linear subspace to produce a third vector which belongs to the linear subspace;

generating a norm signal based upon the third vector which belongs to the linear subspace; and determining if the fundamental pattern of the first image matches the test pattern of the second image based on the norm signal.

9. The pattern recognition method according to claim 8, wherein the step of generating the set of data structures includes the step of:

providing the plurality of second vectors indicative of the first image having pixels of the fundamental pattern displaced in parallel relative to the first position.

10. The pattern recognition method according to claim 8, wherein the step of generating the set of data structures includes the step of:

providing the plurality of second vectors indicative of the first image having pixels of the fundamental pattern displaced rotationally with respect to the first position.

11. A pattern recognition apparatus for inspecting an outward appearance of a test object, comprising:

means for producing a first signal that represents a first image having a fundamental pattern indicative of a fundamental object, the first image being a reference;

means for producing a second signal that represents a second image, the second image having a test pattern indicative of the test object;

means for generating a set of vectors based upon said first signal including a first vector indicative of the fundamental pattern of the first image disposed in a first position and a plurality of second vectors indicative of the fundamental pattern disposed in a plurality of respective different positions from the first position;

means for generating a linear subspace spanned by the first vector and the plurality of second vectors:

means for generating a test pattern vector indicative of the second image based upon said second signal;

means for projecting the test pattern vector to the generated linear subspace to generate a third vector which belongs to a complementary subspace of the linear subspace;

means for generating a norm signal based upon the third vector which belongs to the complementary subspace; and means for determining if the fundamental pattern of the first image matches the test pattern of the second image based on the norm signal of the third vector.

12. The pattern recognition apparatus according to claim 11, wherein said means for producing said first signal further comprises a first normalizing filter which normalizes the first image, wherein said means for producing said second signal further comprises a second normalizing filter which normalizes the second image, and wherein the first signal and the second signal are generated based on the normalized first image and the normalized second image.

13. A pattern recognition apparatus for inspecting an outward appearance of a test object, comprising:

means for producing a first signal that represents a first image having a fundamental pattern indicative of a fundamental object, the first image being a reference;

means for producing a second signal that represents a second image, the second image having a test pattern indicative of the test object;

means for generating a set of vectors based upon said first signal including a first vector indicative of fundamental pattern of the first image disposed in a first position and a plurality of second vectors indicative of the fundamental pattern disposed in a plurality of respective different positions from the first position;

means for generating a linear subspace sprained by the first vector and the plurality of second vectors:

means for generating a test pattern vector indicative of the second image based upon said second signal;

means for projecting the test pattern vector to the generated linear subspace to generate a third vector which belongs to the linear subspace;

means for generating a norm signal based upon the third vector which belongs to the linear subspace; and means for determining if the fundamental pattern of the first image matches the test pattern of the second image based on the norm signal of the third vector.

14. The pattern recognition apparatus according to claim 13, wherein the means for generating the set of data structures includes:

means for providing the plurality of second vectors indicative of the first image having pixels of the fundamental pattern displaced in parallel relative to the first position.

15. The pattern recognition apparatus according to claim 13, wherein the means for generating the set of data structures includes:

means for providing the plurality of second vectors indicative of the first image having pixels of the fundamental pattern displaced rotationally with respect to the first position.

16. The pattern recognition apparatus according to claim 15, further comprising an image shifter, coupled to the means for producing the first signal and the means for producing the second signal, which shifts a barycenter of the fundamental pattern of the first image to the first position, and shifts a barycenter of the test pattern of the second image to a predetermined position.

* * * * *